US012740356B2

(12) United States Patent
Matsui et al.

(10) Patent No.: US 12,740,356 B2
(45) **Date of Patent: *Sep. 15, 2026**

(54) METHOD FOR FORMING PATTERN OF METAL OXIDE AND METHOD FOR PRODUCING SEMICONDUCTOR ELEMENT

(71) Applicant: Resonac Corporation, Tokyo (JP)

(72) Inventors: Kazuma Matsui, Tokyo (JP); Yuki Oka, Tokyo (JP); Moe Taniwaki, Tokyo (JP)

(73) Assignee: Resonac Corporation, Tokyo (JP)

( * ) Notice: Subject to any disclaimer, the term of this patent is extended or adjusted under 35 U.S.C. 154(b) by 353 days.

This patent is subject to a terminal disclaimer.

(21) Appl. No.: 18/273,605

(22) PCT Filed: Dec. 14, 2021

(86) PCT No.: PCT/JP2021/046122

§ 371 (c)(1),
(2) Date: Jul. 21, 2023

(87) PCT Pub. No.: WO2022/163182

PCT Pub. Date: Aug. 4, 2022

(65) Prior Publication Data

US 2024/0105466 A1 Mar. 28, 2024

(30) Foreign Application Priority Data

Jan. 27, 2021 (JP) ................................ 2021-011198

(51) Int. Cl.
*H10P 50/26* (2026.01)
*H10P 50/28* (2026.01)

(52) U.S. Cl.
CPC .......... *H10P 50/267* (2026.01); *H10P 50/285* (2026.01)

(58) Field of Classification Search
None
See application file for complete search history.

(56) References Cited

U.S. PATENT DOCUMENTS

2011/0111532 A1 5/2011 Ryu et al.
2011/0139748 A1* 6/2011 Donnelly .......... H01J 37/32045 216/37

(Continued)

FOREIGN PATENT DOCUMENTS

JP 2001-044174 A 2/2001
JP 2015-122343 A 7/2015

(Continued)

OTHER PUBLICATIONS

International Search Report for PCT/JP2021/046122 dated Feb. 22, 2022.

*Primary Examiner* — Stephanie P Duclair
(74) *Attorney, Agent, or Firm* — Sughrue Mion, PLLC

(57) ABSTRACT

A method for forming a pattern of metal oxide capable of selectively etching an etching object containing metal oxide relative to a non-etching object and forming a pattern of the metal oxide along a pattern of the non-etching object serving as a template. Metal oxide containing oxide of at least one of tin and indium is etched using an etching gas to form the pattern of the metal oxide. An etching gas containing halon is brought into contact with a member to be etched in the presence of plasma, and etching is performed while a bias power is applied to a lower electrode (2) supporting the member to be etched to selectively etch a metal oxide layer (22) relative to a silicon substrate (24), a template layer (21), and an underlying layer (23), and the predetermined pattern of the template layer (21) is transferred to the metal oxide layer (22).

16 Claims, 1 Drawing Sheet

(56) References Cited

U.S. PATENT DOCUMENTS

2011/0272380 A1 11/2011 Jeong et al.
2014/0073139 A1 3/2014 Suzuki
2015/0179818 A1 6/2015 Ohno
2017/0316935 A1* 11/2017 Tan .......................... G03F 7/427
2018/0012759 A1* 1/2018 Smith ..................... C23C 16/56
2018/0069126 A1 3/2018 Sasaki et al.
2018/0240667 A1 8/2018 Yu et al.
2018/0342403 A1* 11/2018 Anthis .............. H01L 21/28194
2021/0005472 A1 1/2021 Kanarik et al.
2021/0134603 A1 5/2021 Fukuyo

FOREIGN PATENT DOCUMENTS

JP 2018-006742 A 1/2018
JP 2018-041752 A 3/2018
JP 2019021917 A * 2/2019
JP 2020-510994 A 4/2020
TW 201133966 A1 10/2011
TW 201903128 A 1/2019
WO 2012/124726 A1 9/2012

* cited by examiner

METHOD FOR FORMING PATTERN OF METAL OXIDE AND METHOD FOR PRODUCING SEMICONDUCTOR ELEMENT

CROSS REFERENCE TO RELATED APPLICATIONS

This application is a National Stage of International Application No. PCT/JP2021/046122 filed on Dec. 14, 2021, claiming priority based on Japanese Patent Application No. 2021-011198 filed on Jan. 27, 2021.

TECHNICAL FIELD

The present invention relates to a method for forming a pattern of metal oxide and a method for producing a semiconductor element.

BACKGROUND ART

Metal oxides, such as tin oxide and indium oxide, are used as a spacer in the formation of a pattern of a fin in a fin field-effect transistor (FinFET), a hard mask for extreme ultraviolet (EUV) lithography, and the like. Indium tin oxide (ITO), which is a mixture of tin oxide and indium oxide, is used in the production of transparent electrodes.

When the metal oxide is finely processed into a desired shape in the semiconduction production process described above, a step of etching the metal oxide by plasma etching using an etching gas is involved. In the etching in the semiconduction production process, it is important to be able to selectively etch (i.e., etching selectivity) an etching object (metal oxide), which is an object to be etched by the etching gas, relative to a non-etching object, such as a mask, which is not the object to be etched by the etching gas.

As the etching gas for etching the metal oxide, hydrogen halides have been proposed. For example, PTL 1 and PTL 2 disclose technologies of etching tin oxide by plasma etching using an etching gas containing hydrogen bromide or hydrogen chloride.

CITATION LIST

Patent Literatures

PTL 1: JP 2020-510994 A
PTL 2: JP 2018-6742 A

SUMMARY OF INVENTION

Technical Problem

However, the technologies disclosed in PTL 1 and PTL 2 have posed a risk that plasma of the etching gas may etch or embrittle carbon-containing materials, such as a photoresist and amorphous carbon. Therefore, when the non-etching object of a member to be etched is formed of the carbon-containing materials, the shape of a pattern of the non-etching object serving as a template for forming a pattern of the metal oxide collapses, which has posed a risk that the metal oxide cannot be formed into a pattern of a desired shape.

It is an object of the present invention to provide a method for forming a pattern of metal oxide capable of selectively etching an etching object containing metal oxide relative to a non-etching object and forming a pattern of the metal oxide having the shape along the shape of a pattern of the non-etching object serving as a template for forming the pattern of the metal oxide and a method for producing a semiconductor element.

Solution to Problem

To solve the problem described above, one embodiment of the present invention is as described in [1] to described below.

[1] A method for forming a pattern of metal oxide by etching the metal oxide using an etching gas, the metal oxide containing oxide of at least one of tin and indium, includes:

a preparation step of preparing a member to be etched including a base, a metal oxide layer containing the metal oxide and laminated directly or via an underlying layer on the base, and a template layer containing a carbon-containing material and laminated on the metal oxide layer and in which the metal oxide layer is an etching object which is an object to be etched by the etching gas, and the base, the underlying layer, and the template layer are non-etching objects which are not the objects to be etched by the etching gas;

a template manufacturing step of forming a predetermined pattern on the template layer of the member to be etched; and an etching step of bringing a gas containing halon having a fluorine atom, a bromine atom, and a carbon atom in the molecule, in which the number of the carbon atoms is 1 or more and 3 or less, as the etching gas into contact with the member to be etched in which the predetermined pattern is formed on the template layer in the template manufacturing step, in the presence of plasma, performing etching while a bias power is being applied to a lower electrode supporting the member to be etched and selectively etching the metal oxide layer relative to the base, the template layer, and the underlying layer, and transferring the predetermined pattern of the template layer to the metal oxide layer.

[2] The method for forming a pattern of metal oxide according to [1], in which the etching gas is a mixed gas containing the halon and an inert gas.

[3] The method for forming a pattern of metal oxide according to [1], in which the etching gas is a mixed gas containing the halon, an inert gas, and a fluorine-containing compound other than the halon.

[4] The method for forming a pattern of metal oxide according to [2] or [3], in which the concentration of the halon in the mixed gas is 1% by volume or more and 50% by volume or less.

[5] The method for forming a pattern of metal oxide according to any one of [1] to [4], in which the carbon-containing material is at least one of a photoresist and amorphous carbon.

[6] The method for forming a pattern of metal oxide according to any one of [1] to [5], in which the metal oxide layer is laminated on the base via the underlying layer containing a silicon-containing material.

[7] The method for forming a pattern of metal oxide according to [6], in which the silicon-containing material is at least one of polysilicon, silicon oxide, and silicon nitride.

[8] The method for forming a pattern of metal oxide according to any one of [1] to [7], in which the halon is at least one of bromofluoromethane, bromofluoroethylene, and bromofluoropropene.

[9] The method for forming a pattern of metal oxide according to [8], in which the bromofluoromethane is dibromodifluoromethane.

[10] The method for forming a pattern of metal oxide according to [8], in which the bromofluoroethylene is at least one of bromotrifluoroethylene, 1-bromo-2,2-difluoroethylene, (E)-1-bromo-1,2-difluoroethylene, (Z)-1-bromo-1,2-difluoroethylene, 1-bromo-1-fluoroethylene, (E)-1-bromo-2-fluoroethylene, (Z)-1-bromo-2-fluoroethylene, 1,1-dibromo-2-fluoroethylene, (E)-1,2-dibromo-2-fluoroethylene, (Z)-1,2-dibromo-2-fluoroethylene, and tribromofluoroethylene.

[11] The method for forming a pattern of metal oxide according to [8], in which the bromofluoropropene is at least one of (E)-1-bromo-3,3,3-trifluoromethylpropene, (Z)-1-bromo-3,3,3-trifluoromethylpropene, and 2-bromo-3,3,3-trifluoromethylpropene.

[12] The method for forming a pattern of metal oxide according to any one of [1] to includes: performing the etching under process pressure of 1 Pa or more and 10 Pa or less.

[13] The method for forming a pattern of metal oxide according to any one of [1] to includes: performing the etching while a bias power of 10 W or more and 1200 W or less is being applied to the lower electrode supporting the member to be etched.

[14] A method for producing a semiconductor element for producing a semiconductor element using the method for forming a pattern of metal oxide according to any one of [1] to [13], the member to be etched being a semiconductor substrate having the etching object and the non-etching objects, includes: a processing step of removing at least a part of the etching object from the semiconductor substrate by the etching.

Advantageous Effects of Invention

The present invention can selectively etch the etching object containing metal oxide relative to the non-etching objects and form the pattern of the metal oxide having the shape along the shape of a pattern of the non-etching object serving as a template for forming the pattern of the metal oxide.

DESCRIPTION OF EMBODIMENTS

Figure 1:
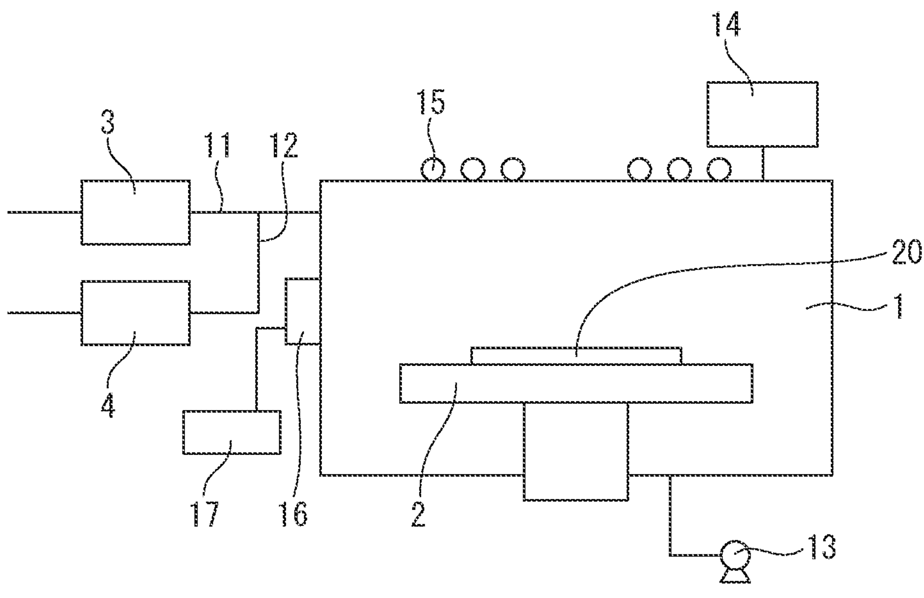
FIG. 1 is a schematic view of one example of a plasma etching apparatus illustrating one embodiment of a method for forming a pattern of metal oxide according to the present invention.

Hereinafter, one embodiment of the present invention is described. This embodiment illustrates one example of the present invention, and the present invention is not limited to this embodiment. This embodiment can be variously modified or improved, and such modified or improved aspects may also be included in the present invention.

A method for forming a pattern of metal oxide of this embodiment is a method for forming a pattern of metal oxide containing oxide of at least one of tin (Sn) and indium (In) by etching the metal oxide using an etching gas. The method for forming a pattern of metal oxide includes a preparation step of preparing a member to be etched, a template manufacturing step of manufacturing a template on the member to be etched, and an etching step of etching the etching member to be etched.

The preparation step is a step of preparing a member to be etched having a base, a metal oxide layer containing the metal oxide and laminated directly or via an underlying layer on the base, and a template layer containing a carbon-containing material and laminated on the metal oxide layer. The metal oxide layer is an etching object, which is an object to be etched by an etching gas. The base, the underlying layer, and the template layer are non-etching objects, which are not the objects to be etched by an etching gas. From the viewpoint of the adhesion with the base, the metal oxide layer is preferably laminated on the base via the underlying layer containing a silicon-containing material.

The template manufacturing step is a step of forming a predetermined pattern on the template layer of the member to be etched and manufacturing a template for etching.

The etching step is a step of etching the metal oxide layer using a gas containing halon having a fluorine atom, a bromine atom, and a carbon atom in the molecule, in which the number of the carbon atoms is 1 or more and 3 or less, as the etching gas.

In more detail, the step includes bringing the etching gas into contact with the member to be etched in which the predetermined pattern is formed on the template layer in the template manufacturing step in the presence of plasma, performing etching while a bias power is being applied to a lower electrode supporting the member to be etched and selectively etching the metal oxide layer relative to the base, the template layer, and the underlying layer, and transferring the predetermined pattern of the template layer to the metal oxide layer.

When the etching gas is brought into contact with the member to be etched, the halon in the etching gas reacts with the oxide in the etching object, and therefore the etching of the metal oxide layer, which is the etching object, proceeds. In contrast thereto, the underlying layer containing the base, the template layer, and the silicon-containing material which are the non-etching objects hardly reacts with the halon, and therefore the etching of the non-etching objects hardly proceeds. Therefore, according to the method for forming a pattern of metal oxide according to this embodiment, the etching object can be selectively etched relative to the non-etching objects.

For example, the etching can be performed such that the ratio of the etching rate of the etching object to the etching rate of the non-etching objects is 2 or more. From the viewpoint of more stably controlling the etching, the etching can be performed such that the etching rate ratio is 4 or more.

Further, according to the method for forming a pattern of metal oxide according to this embodiment, the template layer is difficult to be etched, and therefore the shape of the pattern formed on the template layer is difficult to collapse. Therefore, according to the method for forming a pattern of metal oxide according to this embodiment, the pattern of the metal oxide having the shape along the shape of the pattern of the template layer serving as a template for forming the pattern of the metal oxide can be formed, and therefore the metal oxide can be formed into a pattern of a desired shape.

The method for forming a pattern of metal oxide according to this embodiment can be utilized for the production of a semiconductor element. More specifically, a method for producing a semiconductor element according to this embodiment is a method for producing a semiconductor element for producing a semiconductor element using the method for forming a pattern of metal oxide according to this embodiment, the member to be etched being a semiconductor substrate having the etching object and the non-etching objects, and the method includes a processing step of removing at least a part of the etching object from the semiconductor substrate by etching.

Therefore, the application of the method for forming a pattern of metal oxide according to this embodiment to a semiconductor element production process enables the transfer of the pattern formed on a photoresist to the metal oxide layer or the removal of a film or a residue of the metal oxide present on a film of the non-etching object, for example.

Hereinafter, the method for forming a pattern of metal oxide and the method for producing a semiconductor element according to this embodiment are described in more detail.

The etching in the method for forming a pattern of metal oxide according to this embodiment can be achieved by plasma etching. The type of a plasma source in the plasma etching is not particularly limited, and a commercially available device may be used. For example, high frequency discharge plasma, such as inductively coupled plasma (ICP) or capacitively coupled plasma (CCP) and microwave discharge plasma, such as electron cyclotron resonance plasma (ECRP), are mentioned.

A plasma etching apparatus in FIG. 1 described in detail later is a plasma etching apparatus using the ICP as the plasma source.

In the method for forming a pattern of metal oxide according to this embodiment, a plasma generation chamber and a chamber where the member to be etched is installed may be separated, and the plasma may be generated in the plasma generation chamber (i.e., remote plasma may be used).

[Etching Gas]

The etching gas used in the method for forming a pattern of metal oxide of this embodiment is a gas containing halon having a fluorine atom, a bromine atom, and a carbon atom in the molecule, in which the number of the carbon atoms is 1 or more and 3 or less. The halon in the present invention is halon having a fluorine atom and a bromine atom among halogenated hydrocarbons in which hydrogen atoms of hydrocarbons are partially or completely substituted with halogen atoms.

The type of the halon is not particularly limited insofar as it has a fluorine atom, a bromine atom, and a carbon atom in the molecule, in which the number of the carbon atoms is 1 or more and 3 or less, and is preferably at least one of bromofluoromethane, bromofluoroethylene, and bromofluoropropene, which are easily available and easily handled. The bromofluoromethane refers to a compound in which the number of the carbon atoms is 1 among the halons above. The bromofluoroethylene refers to an unsaturated compound in which the number of the carbon atoms is 2 among the halons above. The bromofluoropropene refers to an unsaturated compound in which the number of the carbon atoms is 3 among the halons above. In all of the bromofluoromethane, the bromofluoroethylene, and the bromofluoropropene, the number of the fluorine atoms and the number of the bromine atoms are not particularly limited.

Specific examples of the bromofluoromethane include bromotrifluoromethane ($CBrF_3$), dibromodifluoromethane ($CBr_2F_2$), tribromofluoromethane ($CBr_3F$), bromodifluoromethane ($CHBrF_2$), and monobromomonofluoromethane ($CH_2BrF$). In particular, the dibromodifluoromethane is preferable from the viewpoint of being easily vaporizable at normal temperature and pressure and having a relatively low environmental load.

Specific examples of the bromofluoroethylene include bromotrifluoroethylene, 1-bromo-2,2-difluoroethylene, (E)-1-bromo-1,2-difluoroethylene, (Z)-1-bromo-1,2-difluoroethylene, 1-bromo-1-fluoroethylene, (E)-1-bromo-2-fluoroethylene, (Z)-1-bromo-2-fluoroethylene, 1,1-dibromo-2-fluoroethylene, (E)-1,2-dibromo-2-fluoroethylene, (Z)-1,2-dibromo-2-fluoroethylene, and tribromofluoroethylene.

Among the above, bromofluoroethylene having one bromine atom is more preferable from the viewpoint of being easily vaporizable at normal temperature and normal pressure. Examples of the bromofluoroethylene having one bromine atom include bromotrifluoroethylene, 1-bromo-2,2-difluoroethylene, (E)-1-bromo-1,2-difluoroethylene, (Z)-1-bromo-1,2-difluoroethylene, 1-bromo-1-fluoroethylene, (E)-1-bromo-2-fluoroethylene, and (Z)-1-bromo-2-fluoroethylene.

As a specific example of the bromofluoropropene, bromofluoropropene having one bromine atom is preferable from the viewpoint of being easily vaporizable at normal temperature and normal pressure. As the bromofluoropropene having one bromine atom, halon represented by a rational formula of $C_3H_xBrF_{5-x}$ is an optional integer of 0 or more and 4 or less) can be exemplified, for example.

Specific examples thereof include (E)-1-bromopentafluoropropene, (Z)-1-bromopentafluoropropene, 2-bromopentafluoropropene, 3-bromopentafluoropropene, 2-bromo-3,3,3-trifluoropropene, (E)-1-bromo-1,3,3,3-tetrafluoropropene, (Z)-1-bromo-1,3,3,3-tetrafluoropropene, (E)-2-bromo-1,3,3,3-tetrafluoropropene, (Z)-2-bromo-1,3,3,3-tetrafluoropropene, (E)-1-bromo-2,3,3,3-tetrafluoropropene, (Z)-2-bromo-1,3,3,3-tetrafluoropropene, (Z)-1-bromo-3,3,3-trifluoropropene, (E)-1-bromo-3,3,3-trifluoropropene, 3-bromo-2,3,3-trifluoropropene, (E)-1-bromo-1,2-bromo-1,2-difluoropropene, (Z)-1-bromo-1,2-difluoropropene, (E)-1-bromo-1,3-difluoropropene, (Z)-1-bromo-1,3-difluoropropene, (E)-1-bromo-2,3-difluoropropene, (Z)-1-bromo-2,3-difluoropropene, (E)-1-bromo-1,3-difluoropropene, (Z)-1-bromo-1,3-difluoropropene, (E)-1-bromo-1-fluoropropene, (Z)-1-bromo-1-fluoropropene, (E)-1-bromo-2-fluoropropene, (Z)-1-bromo-2-fluoropropene, (E)-1-bromo-3-fluoropropene, (Z)-1-bromo-3-fluoropropene, (E)-2-bromo-1-fluoropropene, (Z)-2-bromo-1-fluoropropene, (E)-2-bromo-3-fluoropropene, (Z)-2-bromo-3-fluoropropene, (E)-3-bromo-1-fluoropropene, (Z)-3-bromo-1-fluoropropene, (E)-3-bromo-2-fluoropropene, (Z)-3-bromo-2-fluoropropene, 3-bromo-3-fluoropropene, and the like.

The halons, such as bromofluoromethane, bromofluoroethylene, and bromofluoropropene, may be used alone or in combination of two or more kinds.

The etching gas may be a gas formed of only halon, may be a mixed gas containing halon and an inert gas, or may be a mixed gas containing halon, an inert gas, and a fluorine-containing compound other than halon.

Examples of the type of the inert gas include, but are not particularly limited to, nitrogen gas ($N_2$), helium (He), neon (Ne), argon (Ar), krypton (Kr), and xenon (Xe). These inert gases may be used alone or in combination of two or more kinds.

By compounding the fluorine-containing compound or an oxidizing gas in the etching gas, the etching rate or the etching selectivity of the member to be etched can be controlled in some cases. The fluorine-containing compound used for the mixed gas is a compound which is gaseous at normal temperature and normal pressure having a fluorine atom in the molecule and is a compound other than the halons above. Examples thereof include fluorine gas ($F_2$), oxygen difluoride ($F_2O$), chlorine trifluoride ($ClF_3$), bromine pentafluoride ($BrF_5$), iodine heptafluoride ($IF_7$), nitrogen trifluoride ($NF_3$), sulfur hexafluoride ($SF_6$), and fluorocarbon. Examples of the fluorocarbon include tetrafluoromethane ($CF_4$), trifluoromethane ($CHF_3$), difluoromethane ($CH_2F_2$), fluoromethane ($CH_3F$), hexafluoroethane ($C_2F_6$), octafluoropropane ($C_3F_8$), octafluorocyclobutane ($C_4F_8$), hexafluoro-1,3-butadiene ($C_4F_6$), and carbonyl fluoride ($COF_2$).

The oxidizing gas is not particularly limited insofar as it has at least one of an oxygen atom, a chlorine atom, and a bromine atom in the molecule and is a compound other than the halons and the fluorine-containing compounds above. Examples thereof include oxygen gas ($O_2$), ozone ($O_3$), nitrous oxide ($N_2O$), nitrogen monoxide (NO), nitrogen dioxide ($NO_2$), chlorine gas ($Cl_2$), hydrogen chloride (HCl), bromine ($Br_2$), hydrogen bromide (HBr), sulfur dioxide ($SO_2$), sulfur trioxide ($SO_3$), silicon tetrachloride ($SiCl_4$), and the like, for example.

The concentration of the halon in the mixed gas is not particularly limited and can be set to larger than 0% by volume and less than 100% by volume, and may be adjusted considering the ignitability of the plasma and the like. To sufficiently increase the ignitability of the plasma, the concentration of the halon in the mixed gas is preferably set to 1% by volume or more and 50% by volume or less and more preferably set to 5% by volume or more and 30% by volume or less.

When the concentration of the halon in the mixed gas is within the numerical ranges above, high etching selectivity is likely to be realized, and the etching selectivity is likely to be 3 or more, for example. The etching selectivity as used herein is a value calculated by dividing the etching rate of the etching object by the etching rate of the non-etching objects.

The concentration of the fluorine-containing compound in the mixed gas is not particularly limited, and can be set to 0.5% by volume or more and 80% by volume or less depending on the type of the fluorine-containing compound. Considering the ignitability of the plasma, the concentration is preferably set to 1% by volume or more and 40% by volume or less and more preferably set to 5% by volume or more and 20% by volume or less.

The use amount of the etching gas in the method for forming a pattern of metal oxide according to this embodiment, e.g., the total flow rate of the etching gas to a chamber where the plasma etching is performed in the plasma etching apparatus, may be adjusted according to the internal volume, the exhaust capacity, the process pressure, and the like of the chamber, for example.

[Conditions of Etching Step]

The pressure condition of the etching step in the method for forming a pattern of metal oxide according to this embodiment is not particularly limited. The plasma etching is preferably performed under the process pressure of 0.2 Pa or more and 30 Pa or less, more preferably performed under the process pressure of 1 Pa or more and 15 Pa or less, still more preferably performed under the process pressure of 1 Pa or more and Pa or less, and particularly preferably performed under the process pressure of 2 Pa or more and 8 Pa or less. When the pressure is within the pressure ranges above, the composition of the plasma is stable, and therefore the reproducibility of the etching can be easily enhanced.

In the plasma etching apparatus, the plasma can be generated by converting the plasma etching gas to the plasma by applying a high-frequency source power to a radio frequency (RF) coil and forming an electric field and a magnetic field, for example. The magnitude of the source power is not particularly limited, and is preferably set to larger than 0 W and 3000 W or less, more preferably set to 100 W or more and 1500 W or less, and still more preferably set to 200 W or more and 1000 W or less. When the magnitude of the source power is within the numerical ranges above, the etching rate of the etching object becomes sufficiently high and the etching selectivity of the etching object becomes sufficiently high.

The temperature condition of the etching step in the method for forming a pattern of metal oxide according to this embodiment is not particularly limited. The temperature of the member to be etched (e.g., semiconductor substrate) in the plasma etching is preferably set to −20° C. or more and 250° C. or less, more preferably set to 0° C. or more and 100° C. or less, and still more preferably set to 20° C. or more and 70° C. or less. When the temperature of the member to be etched in the plasma etching is within the numerical ranges above, the deformation due to the alteration, sublimation, or the like of the resist film formed on the semiconductor substrate is suppressed, for example, and therefore the plasma etching can be performed with a high patterning accuracy. The temperature of the temperature condition as used herein is the temperature of the member to be etched, and the temperature of the lower electrode supporting the member to be etched installed in the chamber of the plasma etching apparatus is also usable.

In the plasma etching, it is necessary to apply a bias power larger than 0 W to the lower electrode supporting the member to be etched. To sufficiently increase the etching selectivity of the etching object to the non-etching objects, the bias power applied to the lower electrode is preferably set to 10 W or more and 1200 W or less, more preferably set to 20 W or more and 800 W or less, and still more preferably set to 30 W or more and 300 W or less. The bias power is preferably set to 5% or more and 90% or less with respect to the source power.

[Member to be Etched]

The member to be etched to be etched by the method for forming a pattern of metal oxide according to this embodiment has the etching object and the non-etching objects, and may be a member having a portion formed of the etching object and portions formed of the non-etching objects or may be a member having, in addition to the portion formed of the etching object and the portions formed of the non-etching objects, those other than the etching object, the non-etching objects.

The shape of the member to be etched is not particularly limited, and may be a plate shape, a foil shape, a film shape, a powder shape, or a lump shape, for example. Examples of the member to be etched include the semiconductor substrate described above.

[Etching Object]

The etching object in the method for forming a pattern of metal oxide of this embodiment is a metal oxide layer containing oxide of at least one of tin and indium, i.e., tin oxide, indium oxide, or indium tin oxide. Examples of the tin oxide include SnO and $SnO_2$. Examples of the indium oxide include $In_2O_3$. The etching object, i.e., metal oxide layer, may be formed of only the oxide, may have a portion formed of only the oxide and a portion formed of other materials, or may be formed of a mixture of the oxide and other materials.

The etching object may be not only a material substantially containing only the oxides of specific metals (tin, indium), but a material containing 10% by mole or more, more preferably 20% by mole or more, and still more preferably 30% by more or more of the oxides of the specific metals. For example, a method for forming a pattern of metal oxide according to this embodiment is also applicable to materials containing impurities and nitrides, oxynitrides, oxyfluorides, and the like of the specific metals above.

The oxide as used herein refers to a compound having metal and oxygen. The oxide is a compound represented by $M_yO_z$ (M is tin or indium, and y and z are optional natural numbers), and is a compound containing metal in a proportion of at least 10% by mole or more, more preferably 15% by mole or more, and still more preferably 20% by mole or more, for example. Specific examples thereof include compounds represented by MO, $M_3O_3$, $MO_2$, $MO_3$, $M_3O_4$, and $M_3O_5$ and the like.

The nitride as used herein refers to a compound having metal and nitrogen. The nitride is a compound represented by $M_aN_b$ (M is tin or indium, and a and b are optional natural numbers), and is a compound containing metal in a proportion of at least 10% by mole or more, more preferably 15% by mole or more, and still more preferably 20% by mole or more, for example. Specific examples thereof include compounds represented by MN, $M_2N$, $M_3N_2$, $M_3N_4$, $M_4N$, $M_7N_3$, and $M_{16}N_2$ and the like.

The oxynitride as used herein refers to a compound having metal, oxygen, and nitrogen. The oxynitride is a compound represented by $M_cN_dO_e$ (M is tin or indium, and c, d, and e are optional natural numbers), and is a compound containing metal in a proportion of at least 10% by mole or more, more preferably 15% by mole or more, and still more preferably 20% by mole, for example.

The oxyfluoride as used herein refers to a compound having metal, oxygen, and fluorine. The oxyfluoride is a compound represented by $M_fF_gO_h$ (M is tin or indium, and f, g, and h are optional natural numbers), and is a compound containing metal in a proportion of at least 10% by mole or more, more preferably 15% by mole or more, and still more preferably 20% by mole or more, for example.

The shape of the material containing the specific metals is not particularly limited, and may be a granular shape, a lump shape, a film shape, a foil shape, or a powder shape.

[Non-Etching Object]

The non-etching objects in the method for forming a pattern of metal oxide according to this embodiment are the base, the underlying layer containing the silicon-containing material optionally provided, and the template layer containing the carbon-containing material. The underlying layer is a layer serving as a substrate of the metal oxide layer, and is preferably formed on the base. The template layer is a layer on which a pattern serving as a template for a pattern formed by etching on the metal oxide layer is formed. The base is a portion forming a foundation of a pattern formation body obtained by the method for forming a pattern of metal oxide according to this embodiment, and is preferably a silicon substrate.

The silicon-containing material used for the underlying layer means a compound having a silicon atom. Examples thereof include compounds having at least one of an oxygen atom and a nitrogen atom and a silicon atom, polysilicon, polysilicon carbon, amorphous silicon (Si), and silicon carbide. Examples of the compound having at least one of an oxygen atom and a nitrogen atom and a silicon atom include silicon oxide, silicon nitride, and silicon oxynitride, for example.

The silicon oxide refers to a compound having silicon and oxygen in an optional ratio, and silicon dioxide ($SiO_2$) can be mentioned as an example. The purity of the silicon oxide is not particularly limited, and is preferably 30% by mass or more, more preferably 60% by mass or more, and still more preferably 90% by mass or more.

The silicon nitride refers to a compound having silicon and nitrogen in an optional ratio, and $Si_3N_4$ can be mentioned as an example. The purity of the silicon nitride is not particularly limited, and is preferably 30% by mass or more, more preferably 60% by mass or more, and still more preferably 90% by mass or more.

The silicon oxynitride refers to a compound having silicon, oxygen, and nitrogen in an optional ratio, and $Si_2N_2O$ can be mentioned as an example.

The carbon-containing material used for the template layer means a compound having a carbon atom. Examples thereof include amorphous carbon (C) and a photoresist.

The photoresist means a photosensitive composition in which physical properties, such as solubility, change by light, an electron beam, or the like. For example, photoresists for g-line, h-line, i-line, KrF, ArF, $F_2$, EUV, and the like are mentioned. The composition of the photoresist is not particularly limited insofar as it is generally used in a semiconductor production step. Examples thereof include compositions containing polymers synthesized from at least one monomer selected from linear olefins, cyclic olefins, (meth)acryloyl group-containing compounds, epoxy group-containing compounds, siloxanes, and polyfunctional alcohols (e.g., glycols). In this specification, the "(meth)acryloyl group" means at least one group of an acryloyl group and a methacryloyl group.

The reaction of the silicon-containing material and the carbon-containing material with the halons above is extremely slow, and therefore the etching hardly proceeds even when the etching is performed by the method for forming a pattern of metal oxide according to this embodiment. Further, even when the silicon-containing material and the carbon-containing material is subjected to the etching by the method for forming a pattern of metal oxide according to this embodiment, the etching hardly proceeds because the vapor pressure of a reaction product with the halons above is low, and the reaction product is deposited on the surface of the non-etching object and functions as a protective film.

When the member to be etched having the etching object and the non-etching objects is etched using the method for forming a pattern of metal oxide according to this embodiment, the etching object can be selectively etched while the non-etching objects being hardly etched. Therefore, the shape of the pattern formed on the template layer which is the non-etching object is difficult to collapse, and therefore the shape of the pattern of the template layer can be accurately transferred to the metal oxide layer while damage to the underlying layer which is the non-etching object is being suppressed.

For example, when the etching is applied using the method for forming a pattern of metal oxide according to this embodiment to the semiconductor substrate having the metal oxide layer formed of tin oxide, the template layer formed of at least one of a photoresist and amorphous carbon, the underlying layer formed of at least one of polysilicon, silicon oxide, and silicon nitride, and the base of a plate shape, such as silicon substrate, it is possible to selectively etch tin oxide and transfer the pattern formed on the template layer to the metal oxide layer.

Hereinafter, an example of performing plasma etching of a tin oxide film, an amorphous silicon film, a silicon oxide film, a silicon nitride film, and a photoresist film formed on the surface of the semiconductor substrate (equivalent to the member to be etched) using the plasma etching apparatus illustrated in FIG. 1 is described. The plasma etching apparatus in FIG. 1 is a plasma etching apparatus using the ICP as the plasma source. First, the plasma etching apparatus in FIG. 1 is described.

The plasma etching apparatus in FIG. 1 includes a chamber 1 inside which the plasma etching is performed, a lower electrode 2 supporting a member to be etched 20 to be plasma-etched inside the chamber 1, a power supply for bias power (not illustrated) applying a bias power to the lower electrode 2, an RF coil 15 forming an electric field and a magnetic field inside the chamber 1 for converting the etching gas to plasma, a power supply for source power (not illustrated) applying a high-frequency source power to the RF coil 15, a vacuum pump 13 reducing the pressure inside the chamber 1, a pressure gauge 14 measuring the pressure inside the chamber 1, a sensor 16 capturing plasma emission accompanying the generation of plasma, and a spectrometer 17 spectrally separating the plasma emission captured by the sensor 16 and monitoring a change over time in the plasma emission.

Figure 2:
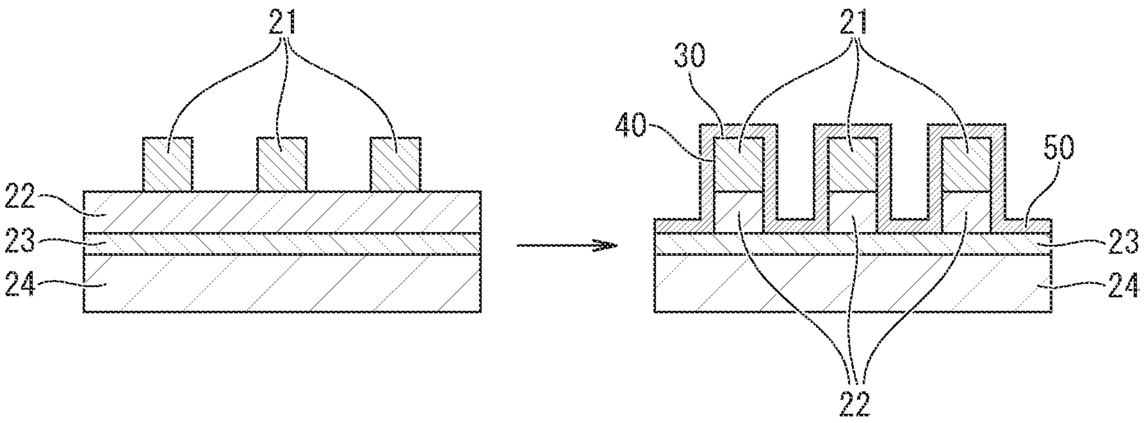
FIG. 2 is a cross-sectional view illustrating one example of a member to be etched before etching and one example of the member to be etched after the etching.

The member to be etched 20 includes a silicon substrate 24, an underlying layer 23 formed on the surface of the silicon substrate 24, a metal oxide layer 22 laminated on the underlying layer 23, and a template layer 21 laminated on the metal oxide layer 22 as illustrated in FIG. 2 drawn on the left side of the arrow. The template layer 21 is formed of at least one of a photoresist and amorphous carbon, and has the predetermined pattern to be transferred to the metal oxide layer 22 formed thereon.

The number of the underlying layers 23 may be one layer as illustrated in the figure, and two or more layers of the underlying layers 23 may be provided between the metal oxide layer 22 and the silicon substrate 24. The underlying layer 23 contains the silicon-containing material, and may contain a metal material together with the silicon-containing material. Examples of the metal material include simple substances of cobalt, nickel, copper, titanium, tantalum, ruthenium, germanium, aluminum, lanthanum, hafnium, and zirconium, oxides, nitrides, oxynitrides, carbides, and metal silicides thereof, and the like.

As the sensor 16, a CCD (Charge-Coupled Device) image sensor is usable, for example. However, instead of providing the sensor 16 and the spectrometer 17, it may be acceptable to provide a viewing window in the chamber 1, visually observe the inside of the chamber 1 from the viewing window, and confirm the change over time in the plasma emission.

The chamber 1 further includes an etching gas supply unit supplying the etching gas into the chamber 1. The etching gas supply unit includes a halon gas supply unit 3 supplying a halon gas, an inert gas supply unit 4 supplying an inert gas, an etching gas supply pipe 11 connecting the halon gas supply unit 3 and the chamber 1, and an inert gas supply pipe 12 connecting the inert gas supply unit 4 to an intermediate portion of the etching gas supply pipe 11.

When the halon gas is supplied as the etching gas to the chamber 1, the halon gas is sent from the halon gas supply unit 3 to the etching gas supply pipe 11, so that the halon gas is supplied to the chamber 1 through the etching gas supply pipe 11.

The pressure in the chamber 1 before supplying the etching gas is not particularly limited insofar as the pressure is equal to or less than the supply pressure of the etching gas or less than the supply pressure of the etching gas, and is preferably $10^{-5}$ Pa or more and less than 100 kPa and more preferably 1 Pa or more and 80 kPa or less, for example.

Further, when a mixed gas of the halon gas and the inert gas is supplied as the etching gas, the halon gas is sent from the halon gas supply unit 3 to the etching gas supply pipe 11 and the inert gas is sent from the inert gas supply unit 4 to the etching gas supply pipe 11 through the inert gas supply pipe 12. Thus, the halon gas and the inert gas are mixed in the intermediate portion of the etching gas supply pipe 11 to form a mixed gas, so that this mixed gas is supplied to the chamber 1 through the etching gas supply pipe 11.

When the mixed gas of the halon gas, the inert gas, and the fluorine-containing compound gas is supplied as the etching gas, it may be acceptable that the etching gas supply unit is configured to have a fluorine-containing compound gas supply unit and a fluorine-containing compound gas supply pipe together with the halon gas supply unit 3, the inert gas supply unit 4, the etching gas supply pipe 11, and the inert gas supply pipe 12, and the same operation is performed in the same manner as in the case of supplying the mixed gas of the halon gas and the inert gas as the etching gas.

When the plasma etching is performed using such a plasma etching apparatus, the member to be etched 20 is placed on the lower electrode 2 arranged inside the chamber 1, the pressure inside the chamber 1 is reduced to, for example, 1 Pa or more and 10 Pa or less by the vacuum pump 13, and then the etching gas is supplied into the chamber 1 by the etching gas supply unit. Then, when a high frequency (e.g., 13.56 MHz) source power is applied to the RF coil 15, electrons are accelerated by the formation of an electric field and a magnetic field inside the chamber 1, and the accelerated electrons collide with halon molecules in the etching gas to generate new ions and electrons, and, as a result, discharge occurs and plasma is formed. The generation of the plasma can be confirmed using the sensor 16 and the spectrometer 17.

When the plasma is generated, the metal oxide layer 22 formed on the surface of the member to be etched 20 is etched. When a detail description is given referring to FIG. 2, a region covered with the template layer 21 is not etched and an exposed region not covered with the template layer 21 is etched in the metal oxide layer 22. As a result, the pattern formed on the template layer 21 is transferred to the metal oxide layer 22, and the pattern having the shape along the shape of the pattern formed on the template layer 21 is formed on the metal oxide layer 22 (see the figure drawn on the right side of the arrow in FIG. 2).

Herein, the polymer layer 50 drawn on the right side of the arrow in FIG. 2 is described. The polymer of the polymer layer 50 is derived from the halon, which is the etching gas. For example, when the halon is 1-bromo-1-fluoroethylene, the 1-bromo-1-fluoroethylene is decomposed by plasma to form $CF_2$, and polytetrafluoroethylene is formed from the $CF_2$. Then, the generated polytetrafluoroethylene is deposited on the template layer 21, the metal oxide layer 22, and the underlying layer 23, so that the polymer layer 50 is formed. The 1-bromo-1-fluoroethylene is decomposed by plasma to generate Br, and the Br reacts with the template layer 21, the metal oxide layer 22, and the underlying layer 23 to generate a substance having a low vapor pressure, so that a film containing the substance having a low vapor pressure is formed on the surfaces of the template layer 21, the metal oxide layer 22, and the underlying layer 23.

By the deposition of the polymer on the surfaces of the template layer 21 and the underlying layer 23 or the formation of the film containing the substance having a low vapor pressure, the etching of the template layer 21 and the underlying layer 23 is suppressed. Therefore, the above-described etching selectivity becomes high. Further, the shape of the pattern formed on the template layer 21 is difficult to collapse, and therefore the shape of the pattern of the template layer 21 can be accurately transferred to the metal oxide layer 22.

When the amount of the polymer to be deposited is excessively small, the above-described etching selectivity decreases. On the other hand, when the amount of the polymer to be deposited is excessively large, there is a risk that the pattern formed on the template layer 21 is blocked by the polymer, so that the etching of the metal oxide layer 22 does not proceed. The polymer layer 50 is preferably formed with a thin and uniform film thickness on a top portion 30 and a side wall portion 40 of the template layer 21. To that end, the deposition rate of the polymer is preferably 0.1 nm/min or more and 30 nm/min or less and more preferably 1 nm/min or more and 20 nm/min or less.

The supply amount of the etching gas to the chamber 1 and the concentration of the halon gas in the etching gas (mixed gas) can be adjusted by controlling the flow rates of the halon gas and the inert gas with mass flow controllers (not illustrated) installed in the etching gas supply pipe 11 and the inert gas supply pipe 12, respectively.

From the viewpoint of uniformly etching the surface of the member to be etched 20, the pressure of the etching gas supplied into the chamber 1 is preferably 0.01 Pa or more and 500 Pa or less, more preferably 0.1 Pa or more and 100 Pa or less, still more preferably 1 Pa or more and 30 Pa or less, and particularly preferably 2 Pa or more and 10 Pa or less. When the pressure of the etching gas in the chamber 1 is within the ranges above, the etching object is likely to be etched at a sufficient rate and the ratio of the etching rate to the non-etching objects, i.e., etching selectivity, is likely to be high.

EXAMPLES

Hereinafter, the present invention is more specifically described with reference to Examples and Comparative Examples described below.

Example 1

A member to be etched was plasma-etched using an ICP etching apparatus RIE-200iP manufactured by Samco Inc. having substantially the same configuration as that of the plasma etching apparatus in FIG. 1.

This member to be etched had the same configuration as that of the figure drawn on the left side of the arrow in FIG. 2. More specifically, the underlying layer 23 having a film thickness of 100 nm was formed on a square silicon substrate 24 having a side of 2 inches, the metal oxide layer 22 having a film thickness of 100 nm was formed on the underlying layer 23, and the template layer 21 having a film thickness of 500 nm was formed on the metal oxide layer 22.

The underlying layer 23 was formed of polysilicon, the metal oxide layer 22 was formed of tin oxide, and the template layer 21 was formed of a photoresist (TARF (registered trademark) manufactured by TOKYO OHKA KOGYO CO., LTD.) or amorphous carbon.

On the template layer 21, a pattern patterned with a line and space having a width of 250 nm was formed. When the template layer 21 was formed of a photoresist, the patterning was performed by exposing the photoresist through a photomask on which the predetermined pattern was drawn, and then removing an exposed portion by a solvent.

When the template layer 21 was formed of amorphous carbon, the patterning was performed as follows. First, a silicon oxynitride film was formed on the amorphous carbon layer, and a photoresist film patterned in the same manner as described above was formed on the silicon oxynitride film. Thereafter, the silicon oxynitride and the amorphous carbon of a portion where the photoresist was not formed were removed by plasma etching, and the pattern of the photoresist film was transferred to the silicon oxynitride film and the amorphous carbon film. Finally, a member to be etched having the amorphous carbon layer patterned by removing the silicon oxynitride film and the photoresist film was prepared.

The internal volume of the chamber was 46000 $cm^3$, and the etching gas was a mixed gas of a 1-bromo-1-fluoroethylene gas and argon (Ar). The concentration of the 1-bromo-1-fluoroethylene gas in the etching gas was adjusted to 10% by volume by setting the flow rate of the 1-bromo-1-fluoroethylene gas to 10 sccm and the flow rate of the argon to 90 sccm. sccm as used herein is a volume flow rate ($cm^3$) per minute standardized under the conditions of 0° C., 1 atm.

The process pressure inside the chamber was set to 3 Pa, the source power was set to 600 W, the bias power was set to 50 W, and the temperature of the member to be etched was set to 20° C. Then, the flow rate of the 1-bromo-1-fluoroethylene gas, the flow rate of the argon, the process pressure, the source power, and the bias power were constantly monitored, and the plasma etching was performed for 5 minutes while confirming that there was no difference between each set value and the execution value.

After the etching was completed, the member to be etched was taken out from the chamber of the etching apparatus, and the member to be etched was analyzed by a scanning electron microscope (SEM). More specifically, the member to be etched after the completion of the etching was visually observed, and it was confirmed that the shape of the pattern of the template layer 21 was transferred to the metal oxide layer 22. The etching rate of the metal oxide layer 22 was determined by dividing the film thickness of the metal oxide layer 22 before the etching by an etching time. The results are shown in Table 1.

Further, on the surface of the member to be etched after the completion of the etching, the polymer layer 50 formed by depositing the polymer derived from the halon was formed (see the figure drawn on the left side of the arrow in FIG. 2), and therefore the thicknesses of the polymer layer 50 formed on the top portion 30 and the side wall portion 40 of the template layer 21 were individually measured. Then, the thickness of the polymer layer 50 was divided by the etching time, thereby calculating the deposition rates of the polymers on the top portion 30 and the side wall portion 40 of the template layer 21. The results are shown in Table 1.

The SEM measurement conditions are as follows.

Measuring instrument: JSM-7900F manufactured by JEOL

Acceleration voltage: 5 kV

Magnification: 10000 times

TABLE 1

| Etching gas | Temperature of | Pressure | Source | Bias | Etching |
|---|---|---|---|---|---|

TABLE 1-continued

| | Composition | Flow rate (mL/min) | lower electrode (° C.) | in chamber (Pa) | power (W) | power (W) | time (min) |
|---|---|---|---|---|---|---|---|
| Ex. 1 | 1-bromo-1-fluoroethylene/Ar | 10/90 | 20 | 3 | 200 | 50 | 5 |
| Ex. 2 | 1-bromo-1-fluoroethylene/Ar | 10/90 | 20 | 3 | 200 | 50 | 5 |
| Ex. 3 | 1-bromo-1-fluoroethylene/Ar | 10/90 | 20 | 3 | 200 | 50 | 5 |
| Ex. 4 | (E)-1-bromo-2-fluoroethylene/Ar | 10/90 | 20 | 3 | 200 | 50 | 5 |
| Ex. 5 | (Z)-1-bromo-2-fluoroethylene/Ar | 10/90 | 20 | 3 | 200 | 50 | 5 |
| Ex. 6 | Dibromodifluoromethane/Ar | 10/90 | 20 | 3 | 200 | 50 | 5 |
| Ex. 7 | Bromotrifluoroethylene/Ar | 10/90 | 20 | 3 | 200 | 50 | 5 |
| Ex. 8 | 1-bromo-2,2-difluoroethylene/Ar | 10/90 | 20 | 3 | 200 | 50 | 5 |
| Ex. 9 | 1-bromo-1-fluoroethylene/Ar | 10/90 | 20 | 3 | 200 | 150 | 2.5 |
| Ex. 10 | 1-bromo-1-fluoroethylene/Ar | 10/90 | 80 | 3 | 200 | 50 | 3 |
| Ex. 11 | 1-bromo-1-fluoroethylene/Ar | 10/90 | −10 | 3 | 200 | 50 | 10 |
| Ex. 12 | 1-bromo-1-fluoroethylene/Ar | 10/90 | 20 | 7 | 200 | 50 | 5 |
| Ex. 13 | 1-bromo-1-fluoroethylene/Ar | 10/90 | 20 | 3 | 600 | 50 | 5 |
| Ex. 14 | 1-bromo-1-fluoroethylene/Ar | 10/90 | 20 | 3 | 200 | 50 | 5 |
| Ex. 15 | 1-bromo-1-fluoroethylene/Ar | 10/90 | 20 | 3 | 200 | 50 | 5 |
| Ex. 16 | (E)-1-bromo-3,3,3,-trifluoromethylpropene/Ar | 10/90 | 20 | 3 | 200 | 50 | 5 |
| Ex. 17 | (Z)-1-bromo-3,3,3,-trifluoromethylpropene/Ar | 10/90 | 20 | 3 | 200 | 50 | 5 |
| Ex. 18 | 2-bromo-3,3,3,-trifluoromethylpropene/Ar | 10/90 | 20 | 3 | 200 | 50 | 5 |
| Comp. Ex. 1 | Tetrafluoromethane/Ar | 10/90 | 20 | 3 | 200 | 50 | 5 |
| Comp. Ex. 2 | HBr/Ar | 10/90 | 20 | 3 | 200 | 50 | 5 |
| Comp. Ex. 3 | $SF_6$/Ar | 10/90 | 20 | 3 | 200 | 50 | 5 |
| Comp. Ex. 4 | $BCl_3$/Ar | 10/90 | 20 | 3 | 200 | 50 | 5 |
| Comp. Ex. 5 | 1-bromo-1-fluoroethylene/Ar | 10/90 | 20 | 3 | 200 | 0 | 5 |

| | Metal oxide layer | | Template layer*[1] | | | Underlying layer | |
|---|---|---|---|---|---|---|---|
| | | | | Polymer deposition rate (nm/min) | | | Film thickness of |
| | Metal oxide type | Etching rate (nm/min) | Carbon-containing material type | Top portion | Side wall portion | Silicon-containing material type | deposited polymer (nm) |
| Ex. 1 | Tin oxide | 20 or more | Amorphous carbon | 8 | 4 | Polysilicon | 30 |
| | | | Photoresist | 7 | 5 | | 27 |
| Ex. 2 | Indium oxide | 20 or more | Amorphous carbon | 8 | 4 | Polysilicon | 30 |
| | | | Photoresist | 7 | 5 | | 27 |
| Ex. 3 | Indium tin oxide | 20 or more | Amorphous carbon | 8 | 4 | Polysilicon | 30 |
| | | | Photoresist | 7 | 5 | | 27 |
| Ex. 4 | Tin oxide | 20 or more | Amorphous carbon | 11 | 8 | Polysilicon | 21 |
| | | | Photoresist | 12 | 8 | | 21 |
| Ex. 5 | Tin oxide | 20 or more | Amorphous carbon | 18 | 15 | Polysilicon | 24 |
| | | | Photoresist | 14 | 12 | | 18 |
| Ex. 6 | Tin oxide | 20 or more | Amorphous carbon | 8 | 16 | Polysilicon | 6 |
| | | | Photoresist | 2 | 14 | | 6 |
| Ex. 7 | Tin oxide | 20 or more | Amorphous carbon | 15 | 9 | Polysilicon | 33 |
| | | | Photoresist | 18 | 7 | | 30 |
| Ex. 8 | Tin oxide | 20 or more | Amorphous carbon | 7 | 5 | Polysilicon | 3 |
| | | | Photoresist | 8 | 6 | | 6 |
| Ex. 9 | Tin oxide | 40 or more | Amorphous carbon | 3 | 1 | Polysilicon | 24 |
| | | | Photoresist | 3 | 1 | | 27 |
| Ex. 10 | Tin oxide | 33 or more | Amorphous carbon | 7 | 5 | Polysilicon | 52 |
| | | | Photoresist | 5 | 4 | | 52 |
| Ex. 11 | Tin oxide | 10 or more | Amorphous carbon | 16 | 10 | Polysilicon | 51 |
| | | | Photoresist | 14 | 10 | | 44 |
| Ex. 12 | Tin oxide | 20 or more | Amorphous carbon | 14 | 8 | Polysilicon | 37 |
| | | | Photoresist | 10 | 7 | | 35 |
| Ex. 13 | Tin oxide | 20 or more | Amorphous carbon | 19 | 15 | Polysilicon | 9 |
| | | | Photoresist | 17 | 15 | | 9 |
| Ex. 14 | Tin oxide | 20 or more | Amorphous carbon | 8 | 4 | Silicon oxide | 15 |
| | | | Photoresist | 7 | 5 | | 15 |
| Ex. 15 | Tin oxide | 20 or more | Amorphous carbon | 8 | 4 | Silicon nitride | 3 |
| | | | Photoresist | 7 | 5 | | 3 |
| Ex. 16 | Tin oxide | 20 or more | Amorphous carbon | 8 | 5 | Polysilicon | 9 |

TABLE 1-continued

| | | | | | | | |
|---|---|---|---|---|---|---|---|
| | | | Photoresist | 9 | 6 | | 9 |
| Ex. 17 | Tin oxide | 20 or more | Amorphous carbon | 7 | 8 | Polysilicon | 9 |
| | | | Photoresist | 8 | 8 | | 12 |
| Ex. 18 | Tin oxide | 20 or more | Amorphous carbon | 5 | 3 | Polysilicon | 17 |
| | | | Photoresist | 8 | 4 | | 16 |
| Comp. | Tin oxide | 10 | Amorphous carbon | −30 | 0 | Polysilicon | *3 |
| Ex. 1 | | | Photoresist | −35 | 0 | | *3 |
| Comp. | Tin oxide | 13 | Amorphous carbon | −20 | 0 | Polysilicon | *3 |
| Ex. 2 | | | Photoresist | −26 | 0 | | *3 |
| Comp. | Tin oxide | 15 | Amorphous carbon | −59 | 0 | Polysilicon | *3 |
| Ex. 3 | | | Photoresist | −77 | 0 | | *3 |
| Comp. | Tin oxide | Unmeasurable | Amorphous carbon | *2 | | Polysilicon | *3 |
| Ex. 4 | | | Photoresist | *2 | | | *3 |
| Comp. | Tin oxide | Polymer | Amorphous carbon | Not measured | | Polysilicon | *3 |
| Ex. 5 | | deposited | Photoresist | Not measured | | | *3 |

*1 A case where the numerical value of the polymer deposition rate is a negative value means that the polymer is not deposited and the etching of the template layer proceeds. The absolute value of the numerical value indicates the etching rate of the template layer.
*2 The template layer was quickly etched, and the pattern shape collapsed.
*3 The etching of the metal oxide layer was not completed and the underlying layer was not exposed, and therefore the polymer was not deposited on the underlying layer.

Examples 2 to 18 and Comparative Examples 1 to 5

Plasma etching was performed in the same manner as in Example 1, except for setting the type of the etching gas, the type of the metal oxide forming the metal oxide layer 22, the type of the silicon-containing material forming the underlying layer 23, and various etching conditions as shown in Table 1, and the etching rate of the metal oxide layer 22 and the deposition rates of the polymers on the top portion 30 and the side wall portion 40 were individually calculated. The results are shown in Table 1. In the column of the etching gas type in Table 1, "HBr" is hydrogen bromide, "$SF_6$" is sulfur hexafluoride, and "$BCl_3$" is boron trichloride.

The results of Examples 1 to 3 show the following. More specifically, by the use of 1-bromo-1-fluoroethylene as the etching gas, the metal oxide layer having a film thickness of 100 nm was completely etched, so that the underlying layer appears, and the etching of the template layer and the underlying layer hardly proceeded until the polymer was deposited on an upper portion of the underlying layer and the top portion and the side wall portion of the template layer, and therefore the tin oxide, the indium oxide, and the indium tin oxide were selectively etched relative to the template layer and the underlying layer. As a result, the pattern of the template layer was able to be transferred to the metal oxide layer while the etching of the template layer and the underlying layer was being suppressed.

The results of Examples 4 to 8 and 16 to 18 show that the pattern of the template layer can be transferred to the metal oxide layer without any problem even when (E)-1-bromo-2-fluoroethylene, (Z)-1-bromo-2-fluoroethylene, dibromodifluoromethane, bromotrifluoroethylene, 1-bromo-2,2-difluoroethylene, (E)-1-bromo-3,3,3-trifluoromethylpropene, (Z)-1-bromo-3,3,3-trifluoromethylpropene, and 2-bromo-3,3,3-trifluoromethylpropene were used as the etching gas.

The result of Example 9 shows that the increase in the bias power improves the etching rate of the metal oxide layer (tin oxide) and suppresses the deposition of the polymer.

The results of Examples 10, 11 show that the higher the temperature of the lower electrode, the higher the etching rate of the metal oxide layer (tin oxide) and the more suppressed the deposition of the polymer.

The result of Example 12 shows that the transfer of the pattern to the metal oxide layer can be performed without any problem even when the pressure in the chamber is increased.

The result of Example 13 shows that the transfer of the pattern to the metal oxide layer can be performed without any problem even when the source power is increased.

The results of Examples 14, 15 show that, even when the silicon-containing material forming the underlying layer is changed to silicon oxide or silicon nitride, the pattern of the template layer can be transferred to the metal oxide layer without etching the underlying layer.

The results of Comparative Examples 1 to 4 show that, when tetrafluoromethane, hydrogen bromide, sulfur hexafluoride, and boron trichloride were used as the etching gas, the etching rate of the template layer is larger than the etching rate of the metal oxide layer (tin oxide), and the etching of the template layer, which is the non-etching object, proceeds preferentially over the metal oxide layer. Thus, these gases are unsuitable for the transfer of the pattern to the metal oxide layer.

The result of Comparative Example 5 shows that, when the bias power is 0 W, the metal oxide layer is not etched. Therefore, the setting of the bias power to 0 W is not suitable for the transfer of the pattern to the metal oxide layer.

Example 19

Plasma etching was performed in the same manner as in Example 1, except that the film thickness of the metal oxide layer 22 was 20 nm, the film thickness of the template layer 21 was 200 nm, a pattern patterned with a line and space having a width of 100 nm was formed on the template layer 21, the pressure in the chamber was 1 Pa, the bias power was 100 W, and the etching time was 30 seconds, and the etching rate of the metal oxide layer 22 and the deposition rates of the polymers on the top portion 30 and the side wall portion 40 were individually calculated. The results are shown in Table 2.

TABLE 2

| Etching gas | Temperature of lower | Pressure in | Source | Bias | Etching |
|---|---|---|---|---|---|

TABLE 2-continued

| | Composition | Flow rate (mL/min) | electrode (° C.) | chamber (Pa) | power (W) | power (W) | time (s) |
|---|---|---|---|---|---|---|---|
| Ex. 19 | 1-bromo-1-fluoroethylene/Ar | 10/90 | 20 | 1 | 200 | 100 | 30 |
| Ex. 20 | 1-bromo-1-fluoroethylene/Ar | 10/90 | 20 | 1 | 200 | 500 | 30 |
| Ex. 21 | 1-bromo-1-fluoroethylene/Ar | 10/90 | 80 | 1 | 200 | 500 | 30 |
| Ex. 22 | 1-bromo-1-fluoroethylene/$CF_4$/Ar | 10/10/80 | 80 | 1 | 200 | 500 | 30 |
| Ex. 23 | Bromotrifluoroethylene/$CF_4$/Ar | 10/10/80 | 80 | 1 | 200 | 500 | 30 |
| Ex. 24 | 1-bromo-2,2-difluoroethylene/$CF_4$/Ar | 10/10/80 | 80 | 1 | 200 | 500 | 30 |
| Ex. 25 | 1-bromo-2,2-difluoroethylene/$O_2$/Ar | 10/10/80 | 80 | 1 | 200 | 500 | 30 |
| Ex. 26 | Dibromodifluoromethane/$CF_4$/Ar | 10/10/80 | 80 | 1 | 200 | 500 | 30 |
| Ex. 27 | (E)-1-bromo-2-fluoroethylene/$CF_4$/Ar | 10/10/80 | 80 | 1 | 200 | 500 | 30 |
| Ex. 28 | (Z)-1-bromo-2-fluoroethylene/$CF_4$/Ar | 10/10/80 | 80 | 1 | 200 | 500 | 30 |
| Comp. Ex. 6 | $CF_4$/Ar | 10/90 | 80 | 1 | 200 | 500 | 30 |
| Comp. Ex. 7 | $C_4F_8$/Ar | 10/90 | 80 | 1 | 200 | 500 | 30 |
| Comp. Ex. 8 | 1-bromo-1-fluoroethylene/Ar | 10/90 | 80 | 1 | 200 | 0 | 30 |

| | Metal oxide layer | | Template layer*1 | | | Underlying layer | |
|---|---|---|---|---|---|---|---|
| | | Etching | Carbon-containing | Polymer deposition rate (nm/min) | | Silicon-containing | Film thickness |
| | Metal oxide type | rate (nm/min) | material type | Top portion | Side wall portion | material type | of deposited polymer (nm) |
| Ex. 19 | Tin oxide | 40 or more | Photoresist | 62 | 35 | Polysilicon | 23 |
| Ex. 20 | Tin oxide | 40 or more | Photoresist | 51 | 40 | Polysilicon | 23 |
| Ex. 21 | Tin oxide | 40 or more | Photoresist | 35 | 30 | Polysilicon | 15 |
| Ex. 22 | Tin oxide | 40 or more | Photoresist | 18 | 16 | Polysilicon | 0 |
| Ex. 23 | Tin oxide | 40 or more | Photoresist | 18 | 16 | Polysilicon | 4 |
| Ex. 24 | Tin oxide | 40 or more | Photoresist | 15 | 14 | Polysilicon | 2 |
| Ex. 25 | Tin oxide | 40 or more | Photoresist | 8 | 8 | Polysilicon | 1 |
| Ex. 26 | Tin oxide | 40 or more | Photoresist | 12 | 13 | Polysilicon | 5 |
| Ex. 27 | Tin oxide | 40 or more | Photoresist | 14 | 11 | Polysilicon | 1 |
| Ex. 28 | Tin oxide | 40 or more | Photoresist | 14 | 11 | Polysilicon | 1 |
| Comp. Ex. 6 | Tin oxide | 6 | Photoresist | −40 | −18 | Polysilicon | *3 |
| Comp. Ex. 7 | Tin oxide | *2 | Photoresist | *2 | | Polysilicon | *2 |
| Comp. Ex. 8 | Tin oxide | Polymer deposited | Photoresist | Not measured | | Polysilicon | Not measured |

*1 A case where the numerical value of the polymer deposition rate is a negative value means that the polymer is not deposited and the etching of the template layer proceeds. The absolute value of the numerical value indicates the etching rate of the template layer.
*2 An opening portion of the template layer was blocked, and therefore the etching of the tin oxide did not proceed.
*3 The etching of the metal oxide layer was not completed and the underlying layer was not exposed, and therefore the polymer was not deposited on the underlaying layer.

Examples 20 to 28 and Comparative Examples 6 to 8

Plasma etching was performed in the same manner as in Example 19, except that the type of the etching gas and various etching conditions were as shown in Table 2, and the etching rate of the metal oxide layer 22 and the deposition rates of the polymers on the top portion 30 and the side wall portion 40 were individually calculated. The results are shown in Table 2. In the column of the etching gas in Table 2, "$CF_4$" is tetrafluoromethane and "$C_4F_8$" is octafluorocyclobutane.

The results of Examples 19 to 21 show that, when 1-bromo-1-fluoroethylene was used as the etching gas, the plasma etching can be performed using the pattern patterned with a line and space having a width of 100 nm. In particular, by increasing the bias power or increasing the temperature of the lower electrode, the film thickness of the deposited polymer can be reduced.

The results of Examples 22 to 28 show that, when bromotrifluoroethylene, 1-bromo-2,2-difluoroethylene, dibromodifluoromethane, (E)-1-bromo-2-fluoroethylene, and (Z)-1-bromo-2-fluoroethylene were used as the etching gas, the pattern formed on the template layer can be transferred to the metal oxide layer. By adding tetrafluoromethane or an oxygen gas to the etching gas, the film thicknesses of the polymers deposited on the top portion and the side wall portion can be reduced.

The result of Comparative Example 6 shows that, when tetrafluoromethane was used as the etching gas, the etching rate of the template layer is larger than the etching rate of the metal oxide layer (tin oxide), and the etching of the template layer, which is the non-etching object, proceeds preferentially over the etching of the metal oxide layer. Thus, tetrafluoromethane is unsuitable for the transfer of the pattern to the metal oxide layer.

Figure 3:
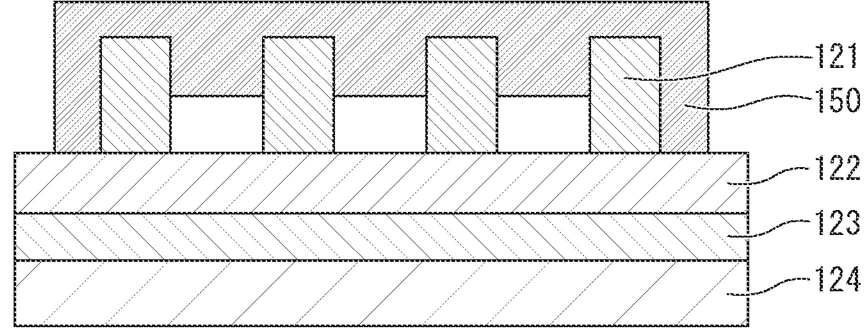
FIG. 3 is a cross-sectional view of a member to be etched illustrating the result of Comparative Example 7.

From the result of Comparative Example 7, when octafluorocyclobutane was used as the etching gas, a polymer layer 150 was deposited to cover an upper portion of a template layer 121, and thus opening portions of the template layer 121 were blocked by the polymer layer 150, so that the etching of a metal oxide layer 122 did not proceed as illustrated in FIG. 3. Thus, octafluorocyclobutane is unsuitable for the transfer of the pattern to the metal oxide layer. In FIG. 3, the reference numeral 123 denotes an underlying layer, and the reference numeral 124 denotes a silicon substrate.

The result of Comparative Example 8 shows that, even when the etching conditions other than the bias power are the same as those of Example 21, the metal oxide layer is not etched when the bias power is 0 W. Therefore, the setting of the bias power to 0 W is not suitable for the transfer of the pattern to the metal oxide layer.

REFERENCE SIGNS LIST

1 chamber
2 lower electrode
3 halon gas supply unit
4 inert gas supply unit
11 etching gas supply pipe
12 inert gas supply pipe
13 vacuum pump
14 pressure gauge
RF coil
16 sensor
17 spectrometer
20 member to be etched
21 template layer
22 metal oxide layer
23 underlying layer
24 silicon substrate
30 top portion
40 side wall portion
50 polymer layer

The invention claimed is:

1. A method for forming a pattern of metal oxide by etching the metal oxide using an etching gas, the metal oxide containing oxide of at least one of tin and indium, the method comprising:

a preparation step of preparing a member to be etched including a base, a metal oxide layer containing the metal oxide and laminated directly or via an underlying layer on the base, and a template layer containing a carbon-containing material and laminated on the metal oxide layer and in which the metal oxide layer is an etching object which is an object to be etched by the etching gas, and the base, the underlying layer, and the template layer are non-etching objects which are not the objects to be etched by the etching gas;

a template manufacturing step of forming a predetermined pattern on the template layer of the member to be etched; and an etching step of bringing a gas containing halon having a fluorine atom, a bromine atom, and a carbon atom in a molecule, in which a number of the carbon atoms is 1 or more and 3 or less, as the etching gas into contact with the member to be etched in which the predetermined pattern is formed on the template layer in the template manufacturing step, in a presence of plasma, performing etching while a bias power is being applied to a lower electrode supporting the member to be etched and selectively etching the metal oxide layer relative to the base, the template layer, and the underlying layer, and transferring the predetermined pattern of the template layer to the metal oxide layer, wherein the halon is at least one of bromofluoromethane, bromofluoroethylene, and bromofluoropropene, wherein the bromofluoromethane is dibromodifluoromethane, wherein the bromofluoroethylene is at least one of bromotrifluoroethylene, 1-bromo-2,2-difluoroethylene, (E)-1-bromo-1,2-difluoroethylene, (Z)-1-bromo-1,2-difluoroethylene, 1-bromo-1-fluoroethylene, (E)-1-bromo-2-fluoroethylene, (Z)-1-bromo-2-fluoroethylene, 1,1-dibromo-2-fluoroethylene, (E)-1,2-dibromo-2-fluoroethylene, (Z)-1,2-dibromo-2-fluoroethylene, and tribromofluoroethylene, and wherein the bromofluoropropene is at least one of (E)-1-bromo-3,3,3-trifluoromethylpropene, (Z)-1-bromo-3,3,3-trifluoromethylpropene, and 2-bromo-3,3,3-trifluoromethylpropene.

2. The method for forming a pattern of metal oxide according to claim 1, wherein the etching gas is a mixed gas containing the halon and an inert gas, and wherein the inert gas is at least one gas selected from the group consisting of nitrogen, ($N_2$), helium (He), neon (Ne), argon (Ar), krypton (Kr), and xenon (Xe).

3. The method for forming a pattern of metal oxide according to claim 2, wherein a concentration of the halon in the mixed gas is 1% by volume or more and 50% by volume or less.

4. The method for forming a pattern of metal oxide according to claim 3, wherein the carbon-containing material is at least one of a photoresist and amorphous carbon.

5. The method for forming a pattern of metal oxide according to claim 2, wherein the carbon-containing material is at least one of a photoresist and amorphous carbon.

6. The method for forming a pattern of metal oxide according to claim 2, wherein the metal oxide layer is laminated on the base via the underlying layer containing a silicon-containing material.

7. The method for forming a pattern of metal oxide according to claim 1, wherein the etching gas is a mixed gas containing the halon, an inert gas, and a fluorine-containing compound other than the halon, and wherein the inert gas is at least one gas selected from the group consisting of nitrogen ($N_2$), helium (He), neon (Ne), argon (Ar), krypton (Kr), and xenon (Xe).

8. The method for forming a pattern of metal oxide according to claim 7, wherein a concentration of the halon in the mixed gas is 1% by volume or more and 50% by volume or less.

9. The method for forming a pattern of metal oxide according to claim 7, wherein the carbon-containing material is at least one of a photoresist and amorphous carbon.

10. The method for forming a pattern of metal oxide according to claim 7, wherein the metal oxide layer is laminated on the base via the underlying layer containing a silicon-containing material.

11. The method for forming a pattern of metal oxide according to claim 1, wherein the carbon-containing material is at least one of a photoresist and amorphous carbon.

12. The method for forming a pattern of metal oxide according to claim 1, wherein the metal oxide layer is laminated on the base via the underlying layer containing a silicon-containing material.

13. The method for forming a pattern of metal oxide according to claim 12, wherein the silicon-containing material is at least one of polysilicon, silicon oxide, and silicon nitride.

14. The method for forming a pattern of metal oxide according to claim 1 comprising: performing the etching under process pressure of 1 Pa or more and 10 Pa or less.

15. The method for forming a pattern of metal oxide according to claim 1 comprising: performing the etching while a bias power of 10 W or more and 1200 W or less is being applied to the lower electrode supporting the member to be etched.

16. A method for producing a semiconductor element for producing a semiconductor element using the method for forming a pattern of metal oxide according to claim 1, the member to be etched being a semiconductor substrate having the etching object and the non-etching object, the method comprising:

a processing step of removing at least a part of the etching object from the semiconductor substrate by the etching.

* * * * *